(12) United States Patent
Runkle et al.

(10) Patent No.: US 7,750,641 B2
(45) Date of Patent: Jul. 6, 2010

(54) BATTERY SYSTEM AND METHOD FOR MONITORING A BATTERY

(75) Inventors: Mark Andrew Runkle, Niskayuna, NY (US); Robert Dean King, Schenectady, NY (US); Lembit Salasoo, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 1235 days.

(21) Appl. No.: 11/290,951

(22) Filed: Nov. 30, 2005

(65) Prior Publication Data

US 2007/0120536 A1    May 31, 2007

(51) Int. Cl.
*G01N 27/416* (2006.01)
(52) U.S. Cl. .................. 324/434; 702/63; 324/426
(58) Field of Classification Search .............. 320/118, 320/132; 324/426, 434; 702/63
See application file for complete search history.

(56) References Cited

U.S. PATENT DOCUMENTS

| 6,020,743 A * | 2/2000 | Reeves et al. ............... 324/434 |
| 6,281,598 B1 | 8/2001 | King ............................ 307/10.1 |
| 6,332,113 B1 * | 12/2001 | Bertness ..................... 702/63 |

* cited by examiner

*Primary Examiner*—Edward Tso
*Assistant Examiner*—Samuel Berhanu
(74) *Attorney, Agent, or Firm*—Marie-Clare Maple (57) ABSTRACT

A battery system and a method for monitoring a battery are provided. The battery has a first plurality of cells electrically coupled in series to one another. The first plurality of cells includes a second plurality of cells and a third plurality of cells electrically coupled together at a node. The method includes calculating a first number of failed cells in the first plurality cells. The method further includes calculating a second number of failed cells in the second plurality cells and a third number of failed cells in the third plurality cells.

9 Claims, 10 Drawing Sheets

TABLE A

|  | INTERVAL 1 | | | INTERVAL 2 | | | INTERVAL (I) | | |
|---|---|---|---|---|---|---|---|---|---|
| BATTERY 1 | Voc(1) | $V_{mid}(1)$ | SP(1) | Voc(2) | $V_{mid}(2)$ | SP(2) | Voc(I) | $V_{mid}(I)$ | SP(I) |
| BATTERY 2 | Voc(1) | $V_{mid}(1)$ | SP(1) | Voc(2) | $V_{mid}(2)$ | SP(2) | Voc(I) | $V_{mid}(I)$ | SP(I) |
| BATTERY (m) | Voc(1) | $V_{mid}(1)$ | SP(1) | Voc(2) | $V_{mid}(2)$ | SP(2) | Voc(I) | $V_{mid}(I)$ | SP(I) |

TABLE B

|  | PERIOD 1 | | | PERIOD 2 | | | PERIOD (P) | | |
|---|---|---|---|---|---|---|---|---|---|
| BATTERY 1 | U(1) | L(1) | SP(1) | U(2) | L(2) | SP(2) | U(P) | L(P) | SP(P) |
| BATTERY 2 | U(1) | L(1) | SP(1) | U(2) | L(2) | SP(2) | U(P) | L(P) | SP(P) |
| BATTERY (m) | U(1) | L(1) | SP(1) | U(2) | L(2) | SP(2) | U(P) | L(P) | SP(P) |

FIG. 7

For j = 0, 1, 2, ...15 and k = 1, 2, 3, ...30,

$$\text{Pmofn}(P, n, m) = \sum_{i=n-m}^{n} P^i * (1-P)^{n-i} * \frac{n!}{(n-i)! * i!}$$

$\text{Prob}_{j,k}$ = if( j > k, then = 1, else = Pmofn(0.5, k, j))

FIG. 8
TABLE C

Number of Failed Cells →

| Prob ← Difference of Failed Cells \|U - L\| → | 24 | 25 | 26 | 27 | 28 | 29 | 30 |
|---|---|---|---|---|---|---|---|
| 0 | $5.96046 \cdot 10^{-8}$ | $2.98023 \cdot 10^{-8}$ | $1.49012 \cdot 10^{-8}$ | $7.45058 \cdot 10^{-9}$ | $3.72529 \cdot 10^{-9}$ | $1.86265 \cdot 10^{-9}$ | $9.31323 \cdot 10^{-10}$ |
| 1 | $1.49012 \cdot 10^{-6}$ | $7.7486 \cdot 10^{-7}$ | $4.02331 \cdot 10^{-7}$ | $2.08616 \cdot 10^{-7}$ | $1.08033 \cdot 10^{-7}$ | $5.58794 \cdot 10^{-8}$ | $2.8871 \cdot 10^{-8}$ |
| 2 | $1.7941 \cdot 10^{-5}$ | $9.71556 \cdot 10^{-6}$ | $5.24521 \cdot 10^{-6}$ | $2.82377 \cdot 10^{-6}$ | $1.51619 \cdot 10^{-6}$ | $8.12113 \cdot 10^{-7}$ | $4.33996 \cdot 10^{-7}$ |
| 3 | $1.38581 \cdot 10^{-4}$ | $7.82609 \cdot 10^{-5}$ | $4.39882 \cdot 10^{-5}$ | $2.46167 \cdot 10^{-5}$ | $1.37202 \cdot 10^{-5}$ | $7.61822 \cdot 10^{-6}$ | $4.21517 \cdot 10^{-6}$ |
| 4 | $7.7194 \cdot 10^{-4}$ | $4.5526 \cdot 10^{-4}$ | $2.66761 \cdot 10^{-4}$ | $1.55374 \cdot 10^{-4}$ | $8.99956 \cdot 10^{-5}$ | $5.18579 \cdot 10^{-5}$ | $2.97381 \cdot 10^{-5}$ |
| 5 | $3.30538 \cdot 10^{-3}$ | $2.03866 \cdot 10^{-3}$ | $1.24696 \cdot 10^{-3}$ | $7.5686 \cdot 10^{-4}$ | $4.56117 \cdot 10^{-4}$ | $2.73056 \cdot 10^{-4}$ | $1.62457 \cdot 10^{-4}$ |
| 6 | 0.01133 | $7.31665 \cdot 10^{-3}$ | $4.67765 \cdot 10^{-3}$ | $2.96231 \cdot 10^{-3}$ | $1.85958 \cdot 10^{-3}$ | $1.15785 \cdot 10^{-3}$ | $7.15453 \cdot 10^{-4}$ |
| 7 | 0.03196 | 0.02164 | 0.01448 | $9.57865 \cdot 10^{-3}$ | $6.27048 \cdot 10^{-3}$ | $4.06503 \cdot 10^{-3}$ | $2.61144 \cdot 10^{-3}$ |
| 8 | 0.07579 | 0.05388 | 0.03776 | 0.02612 | 0.01785 | 0.01206 | $8.0624 \cdot 10^{-3}$ |
| 9 | 0.15373 | 0.11476 | 0.08432 | 0.06104 | 0.04358 | 0.03071 | 0.02139 |
| 10 | 0.27063 | 0.21218 | 0.16347 | 0.12389 | 0.09247 | 0.06802 | 0.04937 |
| 11 | 0.41941 | 0.34502 | 0.2786 | 0.22103 | 0.17246 | 0.13247 | 0.10024 |
| 12 | 0.58059 | 0.5 | 0.42251 | 0.35055 | 0.28579 | 0.22913 | 0.1808 |
| 13 | 0.72937 | 0.65498 | 0.57749 | 0.5 | 0.42528 | 0.35554 | 0.29233 |
| 14 | 0.84627 | 0.78782 | 0.7214 | 0.64945 | 0.57472 | 0.5 | 0.42777 |
| 15 | 0.92421 | 0.88524 | 0.83653 | 0.77897 | 0.71421 | 0.64446 | 0.57223 |

FIG. 10

TABLE D
FAILURE OF 24 CELLS

| CI | L | U | Δ | |
|---|---|---|---|---|
| 99% | 5 | 19 | 14 | D |
| 95% | 7 | 17 | 10 | D |
| 90% | 8 | 16 | 8 | D |
| 85% | 9 | 15 | 6 | I |
| 73% | 10 | 14 | 4 | I |
| 58% | 11 | 13 | 2 | I |
| 50% | 12 | 12 | 0 | I |
| 58% | 13 | 11 | 2 | I |
| 73% | 14 | 10 | 4 | I |
| 85% | 15 | 9 | 6 | I |
| 90% | 16 | 8 | 8 | D |
| 95% | 17 | 7 | 10 | D |
| 99% | 19 | 5 | 14 | D |

FIG. 11

TABLE E
FAILURE OF SEQUENCE

| | L | U | |
|---|---|---|---|
| 1 | + | 0 | I |
| 2 | 0 | + | I |
| 3 | + | 0 | I |
| 4 | + | 0 | I |
| 5 | 0 | + | I |
| 6 | 0 | + | I |
| 7 | + | 0 | I |
| 8 | + | 0 | I |
| 9 | + | 0 | I |
| 10 | + | 0 | I |
| 11 | + | 0 | D |

Hours of Life Remaining vs Number of Failed Cells

BATTERY SYSTEM AND METHOD FOR MONITORING A BATTERY

BACKGROUND OF THE INVENTION

Locomotives are used to haul freight and passengers over long distances. Locomotives have one or more sets of DC/AC traction motors that are powered by an electric generator turned by a diesel or a gas turbine engine. Recently, hybrid locomotives have started to gain acceptance where an energy storage unit is combined with the electric generator to power the motors when operating the locomotive in certain ranges, and for starting the prime mover of the generator.

One type of modern battery for the energy storage units of locomotives, or other energy storage needs, is a very high voltage multi-cell battery made by the Sodium Nickel Chloride ($NaNiCl_2$) technology. These batteries have some characteristics which are helpful in monitoring their use and assist in their applications. Batteries of this type use as many as 480 battery cells coupled in series, where each cell produces 2.5 volts or less. The high voltage of such batteries is the result of a long serial chain of cells that adds the voltage of each cell to the others. Therefore, each battery contains many smaller individual batteries or cells, each with their own finite failure rate.

The individual cells, if they do fail, usually fail in a shorted condition with a resultant low impedance more than 99%+ of the time. The voltage output from this type of battery is relatively flat from 20% to 90% of its charged state. This allows a plurality of these batteries to be paralleled with others, even with some of their cells failed (shorted). The good cells of a battery having failed cells simply see fractional increases in voltage from the other paralleled batteries as their cell string has degraded operational performance with age. If two of the same type of battery are used in parallel, they should age at the same rate and thus balance each other. The limiting factor appears to be if the voltages between the parallel batteries become too markedly different, circulating currents will form between them.

Therefore, the inventors herein have recognized a need to monitor these batteries and to determine whether a predetermined number of cells have failed indicating a failed operational condition of the battery.

A battery can also have cells that fail in a cluster of cells. If the cells of this type of battery are not failing in random locations, it is likely there is physical problem within the battery and it may fail without further warning and should be removed from service.

Therefore, the inventors herein have recognized a need to monitor these batteries and to determine whether the cells have failed in a clustered or nonrandom order indicating a failed operational condition of the battery.

BRIEF DESCRIPTION OF THE INVENTION

A method for monitoring a battery in accordance with exemplary embodiment is provided. The battery has a first plurality of cells electrically coupled in series to one another. The first plurality of cells includes a second plurality of cells and a third plurality of cells electrically coupled together at a node. Each cell of the first plurality of cells has a desired output voltage level during desired operation and failing in a shorted operational condition. The method includes measuring a first voltage level of the first plurality of cells of the battery when the first plurality of cells are not electrically coupled to a load. The method further includes measuring a second voltage level at the node between the second plurality of cells and the third plurality of cells when the first plurality of cells are electrically coupled to the load. The method further includes calculating a first number of failed cells in the first plurality cells based on the first voltage level, the desired output voltage level of each cell of the first plurality of cells, and a number of cells in the first plurality of cells. In the method further includes calculating a second number of failed cells in the second plurality cells based on the first number of failed cells, the desired output voltage level of each cell of the first plurality of cells, and the second voltage level. The method further includes calculating a third number of failed cells in the third plurality cells based on the first number of failed cells, the desired output voltage level of each cell of the first plurality of cells, and the second voltage level.

A battery system in accordance with another exemplary embodiment is provided. The battery system includes a battery having a first plurality of cells electrically coupled in series to one another between a first battery terminal and a second battery terminal. The first plurality of cells include a second plurality of cells and a third plurality of cells coupled together at a node. Each cell of the first plurality of cells has a desired output voltage level during desired operation. The battery system further includes a battery monitor electrically coupled to the battery at the node and at the first and second battery terminals. The battery monitor is configured to measure a first voltage level of the first plurality of cells of the battery when the first plurality of cells are not coupled to a load. The battery monitor is further configured to measure a second voltage level at the node between the second plurality of cells and the third plurality of cells when the first plurality of cells are coupled to the load. The battery monitor is further configured to calculate a first number of failed cells of the first plurality of cells based on the first voltage level, the desired output voltage level of each cell of the first plurality of cells and a number of cells in the first plurality of cells. The battery monitor is further configured to calculate a second number of failed cells of the second plurality of cells based on the second voltage level, the desired output voltage level of each cell of the first plurality of cells and the first number of failed cells. The battery monitor is further configured to calculate a third number of failed cells of the third plurality of cells based on the second voltage level, the desired output voltage level of each cell of the first plurality of cells and the first number of failed cells.

A locomotive in accordance with another exemplary embodiment is provided. The locomotive includes an electrically powered traction motor. The locomotive further includes a battery configured to supply electrical power to the traction motor. The battery has a first plurality of cells electrically coupled in series to one another between a first battery terminal and a second battery terminal. The first plurality of cells include a second plurality of cells and a third plurality of cells coupled together at a node. Each cell of the first plurality of cells has a desired output voltage level during desired operation. The locomotive further includes a battery monitor electrically coupled to the battery at the node and at the first and second battery terminals. The battery monitor is configured to measure a first voltage level of the first plurality of cells of the battery when the first plurality of cells are not coupled to a load. The battery monitor is further configured to measure a second voltage level at the node between the second plurality of cells and the third plurality of cells when the first plurality of cells are coupled to the load. The battery monitor is further configured to calculate a first number of failed cells of the first plurality of cells based on the first voltage level, the desired output voltage level of each cell of the first plurality of cells and a number of cells in the first plurality of cells. The battery monitor is further configured to calculate a second number of failed cells of the second plurality of cells based on the second voltage level, the desired output voltage level of each cell of the first plurality of cells and the first number of failed cells. The battery monitor is further configured to calculate a third number of failed cells of the third plurality of cells based on the second voltage level, the desired output voltage level of each cell of the first plurality of cells and the first number of failed cells.

BRIEF DESCRIPTION OF THE DRAWINGS

FIG. 11 illustrates a Table E of a sequence register for storing data related to which the battery segment a cell failure occurred in;

DETAILED DESCRIPTION

Figure 1:
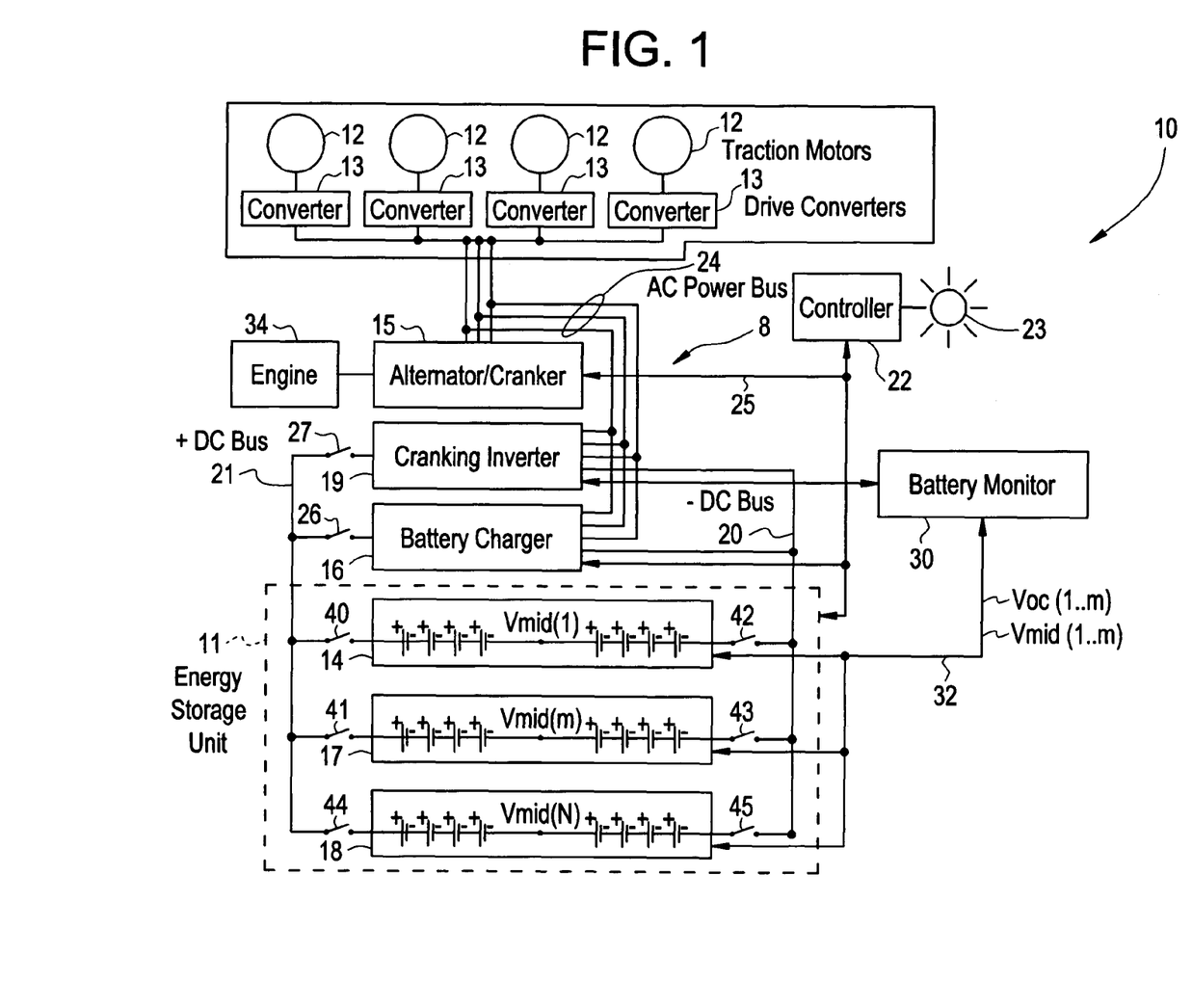
FIG. 1 is a block diagram of a locomotive having a battery monitor and an energy storage unit having a plurality of batteries, in accordance with an exemplary embodiment.

Referring to FIG. 1, a locomotive 10 is illustrated. The locomotive 10 has DC traction motors 12, AC/DC converters 13, and a power system 8. The power system 8 includes an energy storage unit 11, an alternator 15, a battery charger 16, a cranking inverter 19, a DC power bus 21, a controller 22, an AC power bus 24, switches 26, 27, a battery monitor 30, and an engine 34.

The internal combustion engine 34 supplies mechanical power to an alternator 15 used in alternator mode to generate AC electrical power on the bus 24. The AC/DC converters 13 convert electrical power from the AC bus 24 into the DC power necessary to operate the traction motors 12. When used in this manner, the AC electrical power of the alternator/cranker 15 may also be converted into DC electrical power via a battery charger 16, and with switch 26 closed by controller 22, charge and store energy in one or more batteries 14, 17, and 18 of the energy storage unit 11. Alternatively, with switch 27 closed by the controller 22, the energy storage unit 11 may supply its stored DC electrical power to the cranking inverter 19 where it is converted into AC electrical power for use over the AC power bus 24. This AC power may then be used to complement the AC power from the alternator 15 to drive the traction motors 12, or may be used to power the alternator/cranker 15 when used in cranker mode to start the engine 34.

The battery monitor 30 is provided to determine the operational condition and status of the individual batteries 14, 17 and 18 of the energy storage unit 11 by reading certain voltage levels from sense wires 32. The battery monitor comprises a computer having a memory and applicable interfaces. From the] voltage levels obtained from the sense wires 32, the battery monitor 30 can calculate the number of cells of a particular battery that are failed and the relative location in the battery string segments of the failed cells. Based on the calculated values for the number of failed cells and a service parameter value from the controller 22, the battery monitor 30 can determine if an individual battery 14, 17 or 18 is in a failed or good operational condition. If a determination is made that a battery is in a failed operational condition, the battery monitor 30 may optionally store such information in the memory of the battery monitor for later recovery by service personnel, indicate to controller 22 that the controller should enable an indicator 23 of such failed operational condition, or indicate to the controller 22 that the controller should electrically disconnect the failed battery from the energy storage unit 11.

The controller 22 communicates with the power system 8 including the alternator/cranker 15, the cranking inverter 19, the battery charger 16, the energy storage unit 13, and the battery monitor 30 via a communication 25. The controller 22 transmits commands to the various elements of the power system 8 for controlling operation of the power system 8. Further, the controller 22 can determine the actual status and state of the elements over the communications bus 25. Specifically related to the control and use of the energy storage unit 11, the controller 22 is configured to couple and decouple the load of the cranking inverter 19 to and from the energy storage unit by controlling switch 27. The controller 22 is also configured to couple and decouple the power from the battery charger 16 to and from the energy storage unit by controlling switch 26. Further, the controller 22 is configured to switch the individual batteries 14, 17 and 18 into and out of the DC link circuit on DC bus 20 and 21 by control of pairs of switches; in the illustration switches 40 and 42 for battery 14, switches 41 and 43 for battery 17, and switches 44 and 45 for battery 18.

Figure 2:
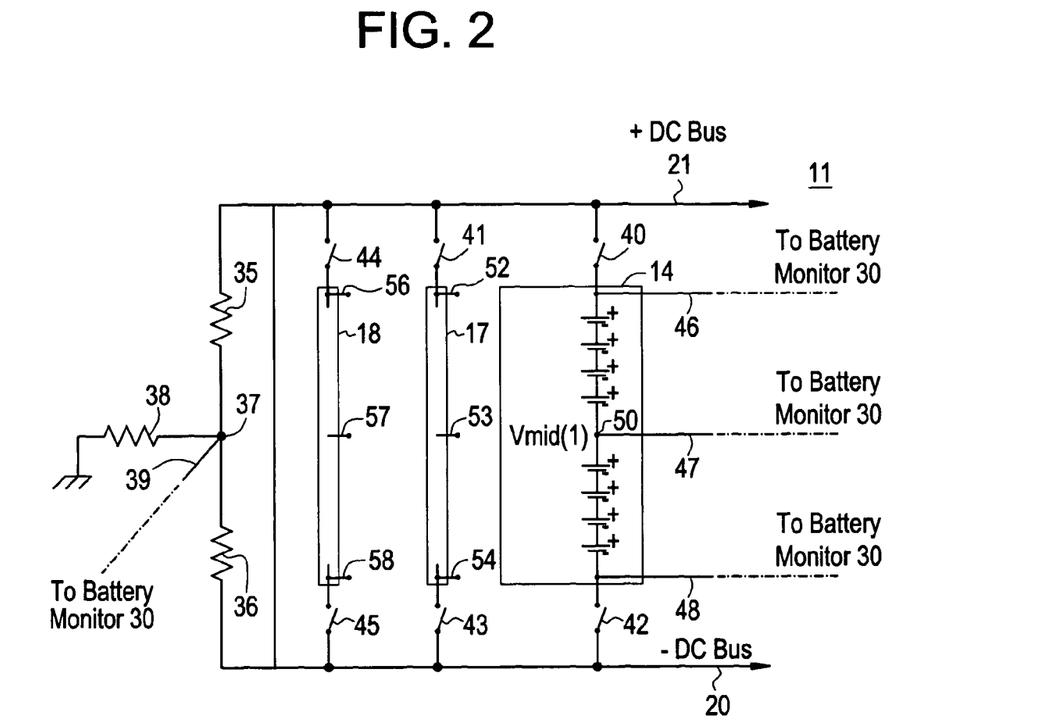
FIG. 2 is an electrical schematic of the energy storage unit illustrated in FIG. 1.

Referring to FIG. 2, each battery, e.g. battery 14, in the energy storage unit 11 is made up of a long string of cells connected electrically in series. Each of these cells has a characteristic voltage $V_{in}$ when it is in a desired operational condition, and the total output of the battery when charged and operating is determined by the equation $V_{out}=N\, V_{in}$ where N represents the number of cells. For the exemplary batteries used in energy storage unit 11 of the Sodium Nickel Chloride ($NaNiCl_2$) technology, the average $V_{in}$ is in the order of 2.58 Vdc and N can be a long string of 480 cells to establish a nominal 1238 Vdc as a DC link voltage to the cranking/inverter 19. The energy storage unit 11 can be made up of multiple batteries of the Sodium Nickel Chloride type, such as batteries 14, 17 and 18 connected in parallel.

At each end of a battery 14, switches 40, 42 are provided to control the connection of the respective battery terminal to the energy storage unit DC link bus 20, 21 and to the rest of the circuitry of the power system 8. A first switch 40 controls the connection of the positive terminal +Vdc of the battery 14 to the power system circuit and a second switch 42 controls the connection of the negative terminal −Vdc of the battery 14 to the power system circuit. In normal operation, when the battery 14 is being charged by the battery charger 16 or power is being drawn from the battery 14 to power the cranking inverter 19, the first and second switches 40, 42 are closed by the controller 22, otherwise they are remain open to conserve the charge on the battery 14. Similarly, batteries 17 and 18 are operated in a like manner by their connection to the DC link bus 20, 21 through switches 41 and 43 for battery 17 and switches 44 and 45 for battery 18. Switches 41, 43, 44, and 45 are additionally controlled as to their switching action by the controller 22.

The energy storage unit 11 also has connected to it a voltage divider comprising a resistor 35, a resistor 36 and a resistor 38. The resistor 36 is connected between the negative terminal −Vdc of the bus 20 and a common node point 37. Similarly, the resistor 35 of equivalent resistance to resistor 36 is connected between the positive terminal +Vdc of the bus 21 and the common node point 37. The resistor 38 is connected between the common node point 37 and ground. The resistor 38 provides a ground reference for the DC link voltage of the locomotive 10. The resistor 38 generates a voltage indicative of a ground fault if either the +Vdc or the −Vdc has another path to the engine chassis somewhere in the system. This voltage can be read and stored in the battery monitor 30 through sense wire 39.

The battery monitor 30 can also calculate the number of failed cells in an individual battery 14 and to a certain degree can ascertain their location in the string by measuring certain voltage levels of the battery. The battery monitor 30 can measure a first voltage level of the battery 14, the open loop voltage (+$V_{oc}$) by its connection to the terminals of the battery through sense conductors 46 and 48. The battery monitor 30 is also connected to at least one other electrical node 50 (that is not a battery terminal in at least one place) to yield a second voltage level from the string. In the embodiment shown, the connection to node 50 for the second voltage level is between the + terminal of cell N/2 and the − terminal of the cell N/2+1 with sense wire 47. The node 50 is an electrical midpoint of the battery and yields the second voltage level, a partial voltage ($V_{mid}$) between one of the battery terminals and node 37, the center of the reference voltage divider. If all the cells in each half of the battery have a desired operational condition, then $V_{mid}$ should be 0 Vdc when both switches 40, 42 are closed. Otherwise, the partial voltage measured is either −$NV_{in}/2$ Vdc or +$NV_{in}/2$ Vdc depending upon which switch is closed while the other switch is open.

It will be evident that more than one electrical connection or node can be utilized for measuring a partial voltage along the string of battery cells. Multiple partial connections could be made for a battery up to the point where every cell voltage in the string could be read and stored for future evaluation. The present embodiment conveniently splits the first plurality of N cells of the battery into two sections or segments, including a second plurality of cells or an upper half U and a third plurality of cells or a lower half L, to produce significant information about the failed cells within the battery without undue complexity. The first and second voltages for batteries 17 and 18 can also be measured by the battery monitor 30 via their respective sense wires 52-54 and 56-58 in a similar manner.

As previously disclosed, the switches 40-45 are commanded by the power controller 22 to be closed upon charging or discharging (loading) a respective battery and open otherwise. Due to the nature of braking the locomotive 10, many opportunities exist for a short time to measure the first voltage level, open circuit voltage $V_{oc}$, while both switches are open with no load and the second voltage level, closed circuit voltage $V_{mid}$, while both switches are closed with load.

Figure 3:
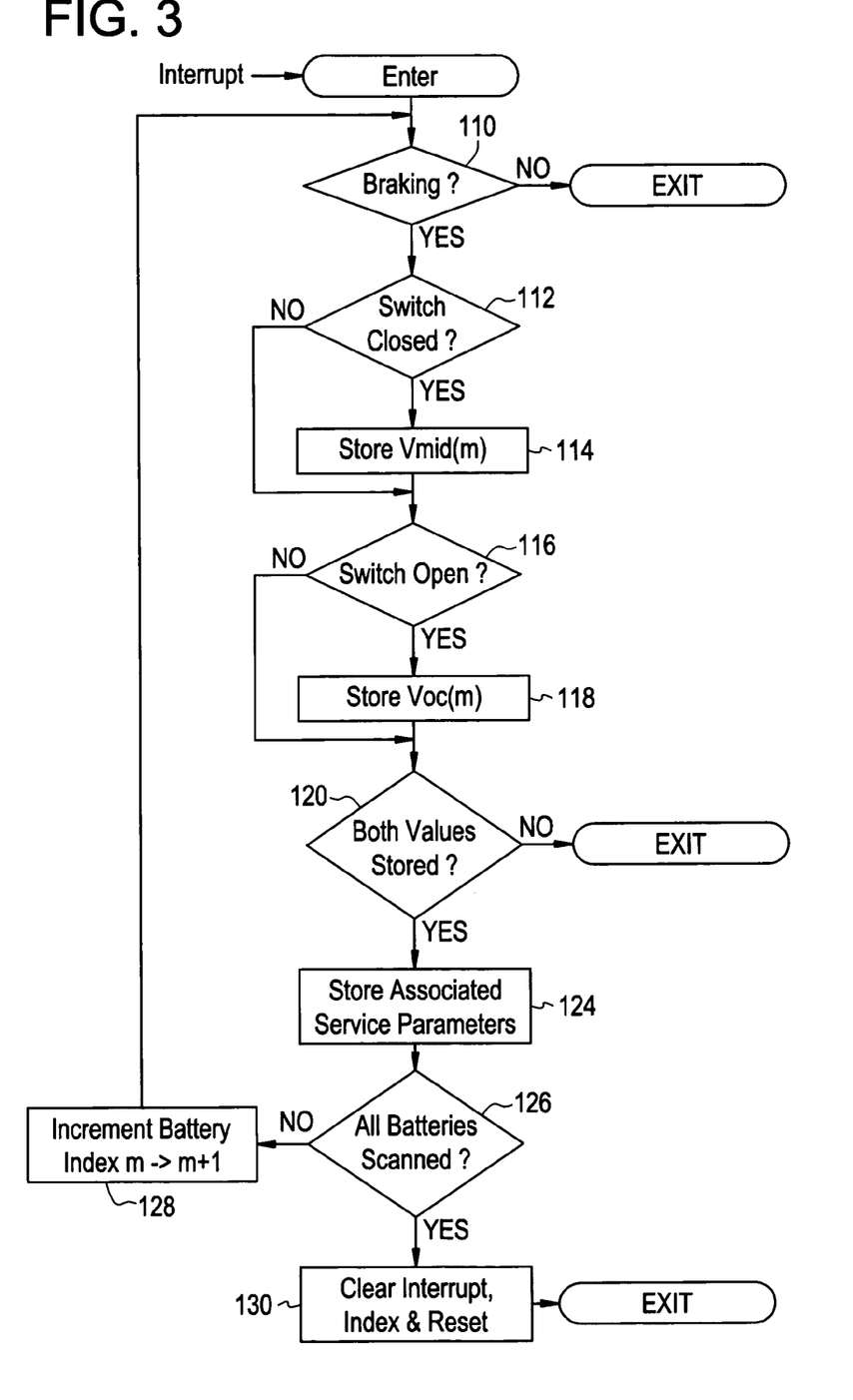
FIG. 3 is a flow chart of a method for measuring voltages for each battery in the energy storage unit of FIG. 1.

Referring to FIG. 3, a method for measuring voltages for each battery of the energy storage unit 11 during braking of the locomotive 10 is illustrated. For purposes of simplicity, the method will be described with respect to testing the battery 14.

At step 110, the controller 22 makes a determination as to whether the locomotive 10 has a braking state. If the value of step 110 equals "yes", the method advances to step 112. Otherwise, the method is exited.

At step 112, the controller 30 makes a determination as to whether the switches 40, 42 of the battery 14 have a closed operational position. If the value of step 112 equals "yes", the method advances to step 114. Otherwise, the method advances to step 116.

At step 114, the battery monitor 30 stores the second voltage level $V_{mid}$ for the battery 14 in a memory. After step 114, the method advances to step 116.

At step 116, the controller 30 makes a determination as to whether the switches 40, 42 have an open operational position. If the value of step 116 equals "yes", the method advances to step 118. Otherwise, the method advances to step 120.

At step 118, the battery monitor 30 stores the first voltage level Voc for the battery 14 in the memory. After step 118, the method advances to step 120.

At step 120, the battery monitor 30 makes a determination as to whether both the first voltage level Voc and the second voltage level $V_{mid}$ have been stored in the memory. If the value of step 120 equals "yes", the method advances to step 124. Otherwise, the method is exited.

At step 124, the battery monitor 30 stores at least one associated service parameter value that relates to the historical operation and expected life of the battery in the memory. The service parameter can be the hours of service life of the battery to the time of measurement; it can be the number of charges, starts (discharges), or special events like deep discharges or ampere-hours used, etc. In on embodiment, the hours that the battery has been in service are stored with each voltage level set. Thus, a history of the life of the battery versus a time of each cell failure is compared to predict when the expected life of the battery will end. After step 124, the method advances to step 126.

At step 126, the battery monitor 30 makes a determination as to whether data has been collected for each of the batteries in the energy storage unit 11. If the value of step 126 equals "yes", the method advances to step 130. Otherwise, the method advances to step 128.

At step 130, the battery monitor 30 clears an internal interrupt and an index m and resets any utilized software pointers. After step 130, the method is exited.

At step 128, the battery monitor 30 increments an index m returns to the step 110.

Figure 4:
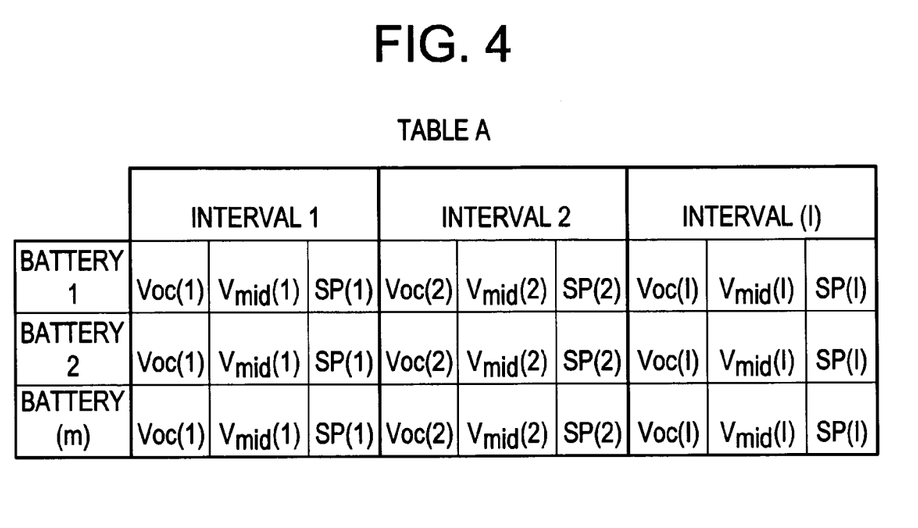
FIG. 4 illustrates a Table A having stored voltage values associated with each battery in the energy storage unit of FIG. 1.

Referring to FIG. 4, the battery monitor 30 maintains a Table A in its memory for this measured data where for every braking interval 1, 2, . . . (I), a set of voltages $V_{oc}$ (1), . . . $V_{oc}$ (I) and $V_{mid}$ (1), . . . $V_{mid}$ (I) and a service parameter SP(1), . . . SP(I) are stored. The three data values are stored every interval for each of the batteries 1, 2, . . . (m) of the energy storage unit 11. The interval used in the measuring of the voltage can occur at each braking event, or at predetermined time intervals.

The values of $V_{oc}$ and $V_{mid}$ allow the battery monitor to calculate how many of a first plurality of N cells of a particular battery are failed and how many of those failed cells are either above or below the node 50 where $V_{mid}$ is measured.

Figure 5:
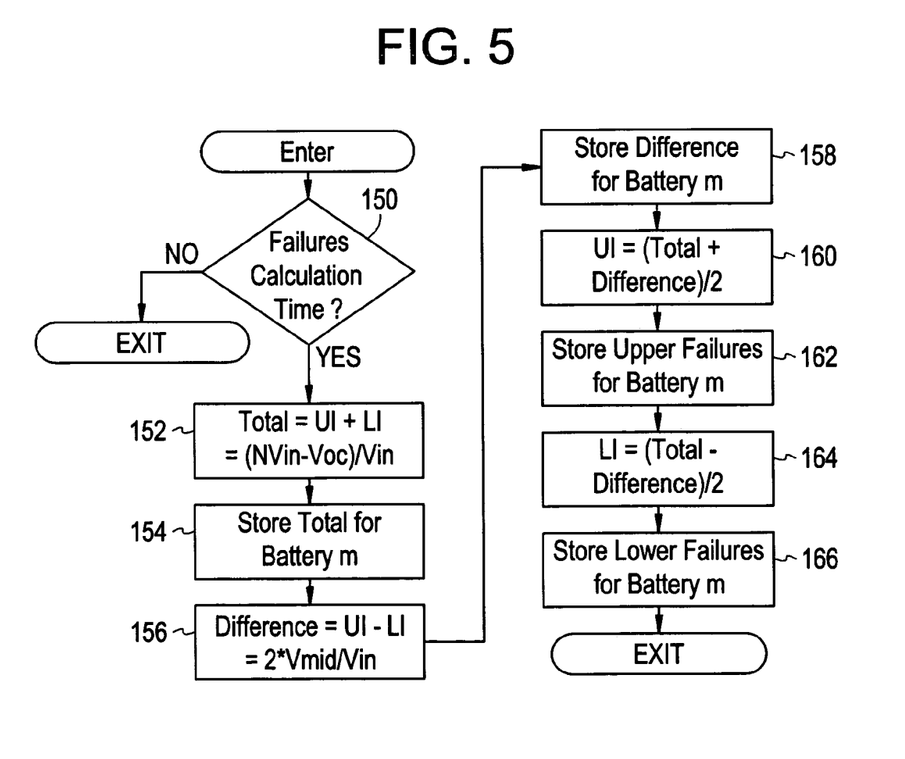
FIG. 5 is a flow chart of a method for calculating a total number cell failures of each battery, the number of cell failures in the upper segment of each battery and the number of cell failures in the lower segment of each.

Referring to FIG. 5, a method for calculating the total number of failed cells, a number of failed cells in an upper segment of the battery 14, and a number of cell failures in a lower segment of the battery 14 will now be described.

At step 150, the battery monitor 30 makes a determination as to whether calculation should be performed to determine a number of cell failures. If the value of step 150 equals "yes", the method advances to step 152. Otherwise, the method is exited.

At step 152, the battery monitor 30 calculates a total number of cell failures in the battery 14 utilizing the following equation:

$$\text{Total number of cell failures} = (N\,V_{in} - V_{oc})/V_{in}, \text{ where}$$

N is the total number of cells in battery 14

Next at step 154, the battery monitor 30 stores the total number of cell failures in a memory.

Next at step 156, the battery monitor 30 calculates a difference value (Diff) between a number of cell failures in the second plurality (upper segment U) of cells and the third plurality (lower segment L) of cells utilizing the following equation: $\text{Diff} = 2\,V_{mid}/V_{in}$.

Next at step 158, the battery monitor 30 stores the difference value (Diff) in the memory.

Next at step 160, the battery monitor 30 calculates a second number of failed cells (U1) for the second plurality of cells (upper segment U) utilizing the following equation: U1=(Total number of cell failures+Diff)/2

Next at step 162, the battery monitor 30 stores the second number of failed cells (U1) in the memory.

Next at step 164, the battery monitor 30 calculates a third number of failed cells (L1) for the second plurality of cells (lower segment L) utilizing the following equation: L1=(Total number of cell failures−Diff)/2

Next at step 166, the battery monitor stores the third number of failed cells (L1) in the memory. After step 166, the method is exited.

Figure 6:
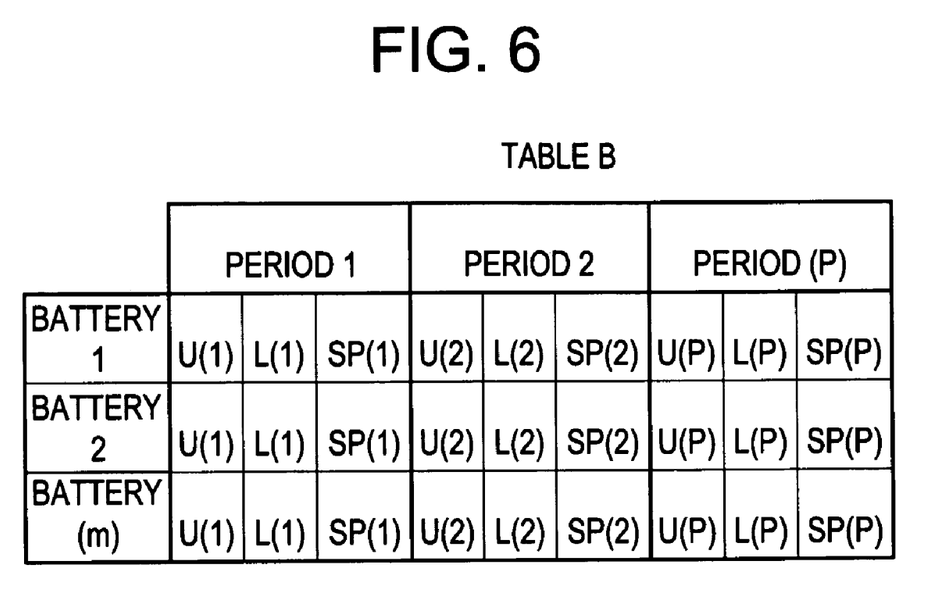
FIG. 6 illustrates a Table B having a number of failed cells of each battery in the energy storage unit of FIG. 1.

Referring to FIG. 6, a data Table B is built up from this data so that for every calculation period P, the second number (U segment) of failed cells U(1), . . . U(P), the third number (L segment) of failed cells L(1), . . . . L(P), and the service parameter SP(1), SP2 . . . . SP(P) associated with each calculation set is stored. It is noted that all three of the first, second and third numbers of failed cells could be stored. However, if any combination of two of the three numbers of failed cells is stored, the third number may be calculated from the other two. While the period in which the data are stored is somewhat arbitrary, it has been found to be advantageous to store data every time the total number of failures changes. In this scheme the data will associate at least one service parameter with each cell failure.

Referring now to FIGS. 7-10, a method to test for the randomness of the cell failures can be performed on the failure data stored by the battery monitor 30 to determine if the cells of a battery are failing randomly, which will be attributable to normal aging, or whether they are failing in clusters, which will be attributable to a physical anomaly that may require the battery to be taken out of service. An elegant test for randomness can be made using the binomial series to represent actual randomness as the probability of the failure rates for the upper and lower sections of the battery being different.

Figure 7:
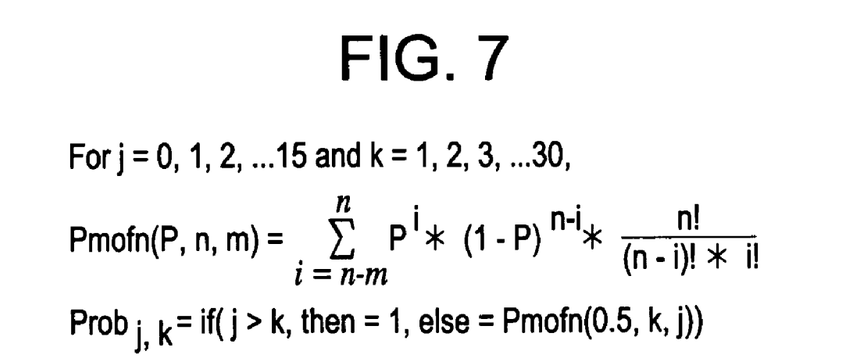
FIG. 7 illustrates a probability function used in a statistical test for cell failure randomness.

The probability formula for the binomial series is shown in FIG. 7 where the probability function Pmofn is the summation of the binomial series from 0 to the index value representing the number of failed cells in the lower half of the battery. In our specific embodiment the probability function Pmofn (P, n, m) is the sum of the binomial series from 0 cells failed in the lower half of the battery to m cells failed out of the total of n cells failed. The probability P is established as 0.5 because of the reasonable assumption that failures in either section are equally probable, if the failure mechanism is independent or random.

Figure 8:
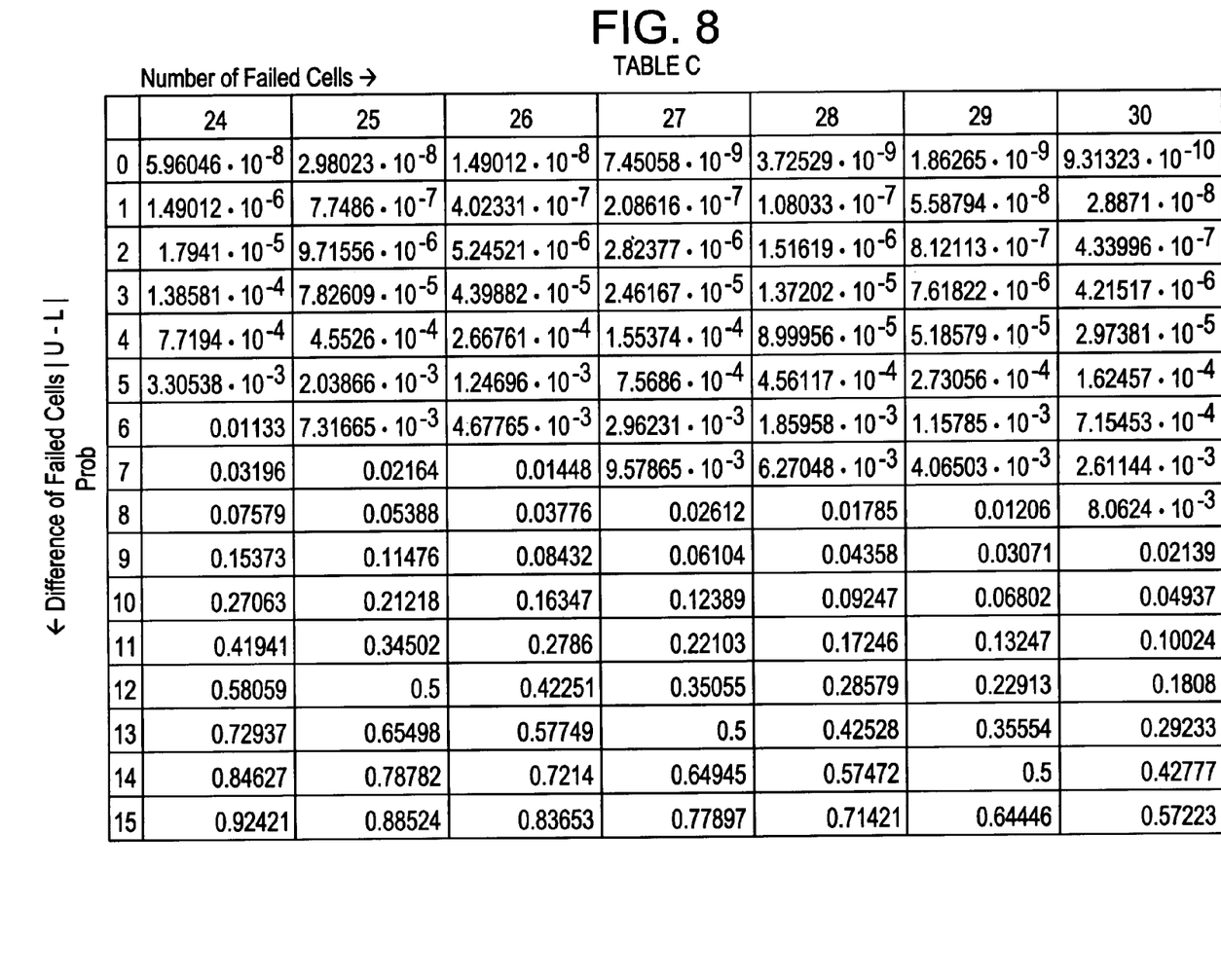
FIG. 8 illustrates a Table C having probability values calculated from the function of FIG. 7.
Figure 9:
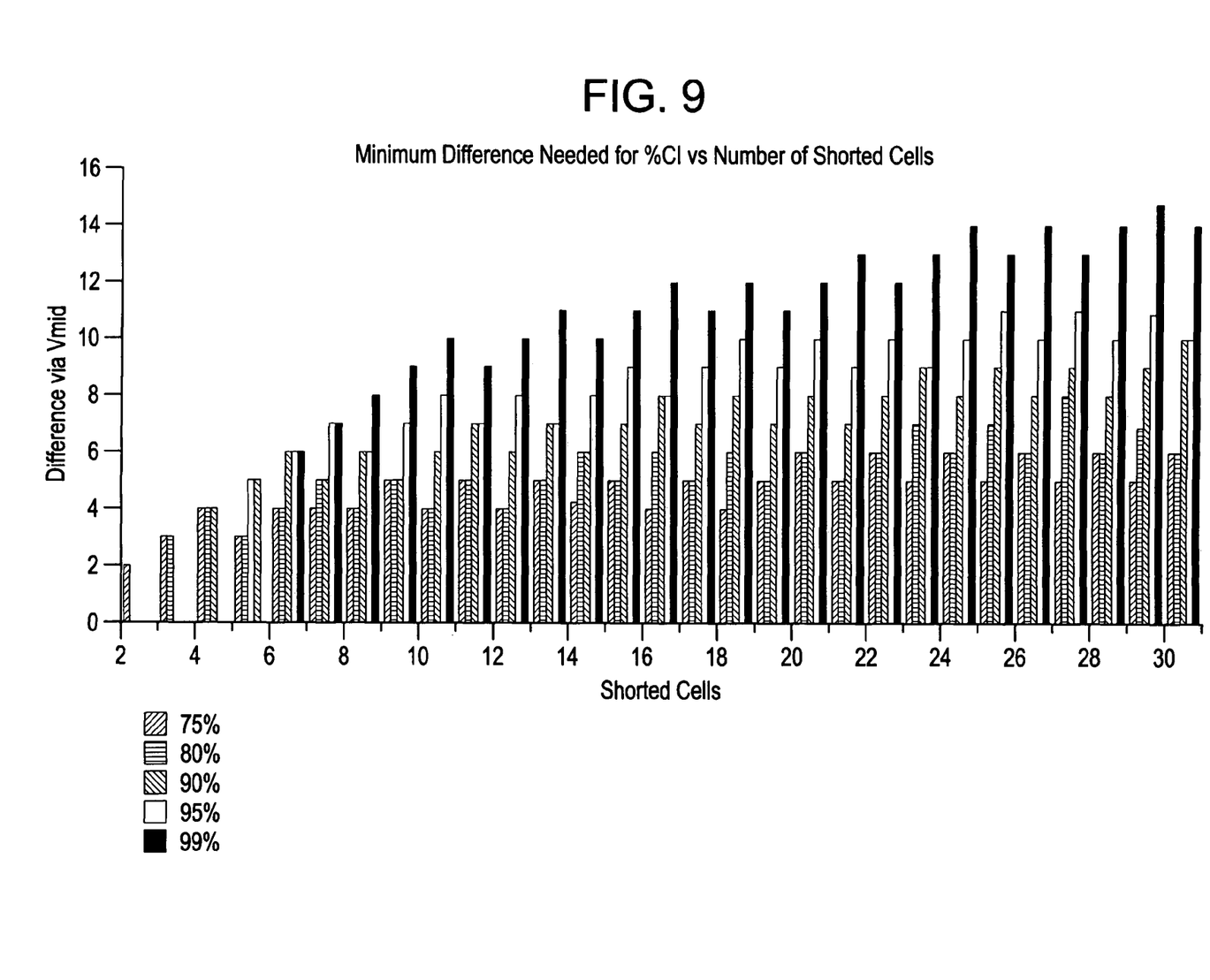
FIG. 9 illustrates a table indicating a confidence level for a dependence determination based on a difference in a battery cell failures for a particular battery segment.

Referring to FIG. 8, a Table C illustrates the calculation of the probability for a number of lower cell failures from 0-15 out of a total number of failures 24-30. The probabilities, calculated as a random distribution of failures from the formula of FIG. 7, can be used in a method to measure of whether the failure data from the battery monitor 30 are showing independent or dependent failures and to what confidence level. FIG. 9 will now be more fully described to illustrate the implementation of that method. In the embodiment of the power system 8 described in FIGS. 1 and 2, the energy storage unit 11 was comprised of one or more batteries of the Sodium Nickel Chloride technology, each having 480 individual cells. It has been determined that this particular battery may have a maximum of 24 cells of the 480 cells (5%) fail before the battery needs to be taken out of service. The figure illustrates the probability for a particular difference of failed cells being dependent as a function of the total number of shorted cells of a battery. As a general rule it will take a greater difference for more total cells failures to determine a certain confidence level or probability. Also, for a predetermined number of cell failures, it will take a greater difference to determine a higher confidence level for a conclusion of dependence of the failure mechanism.

Figure 10:
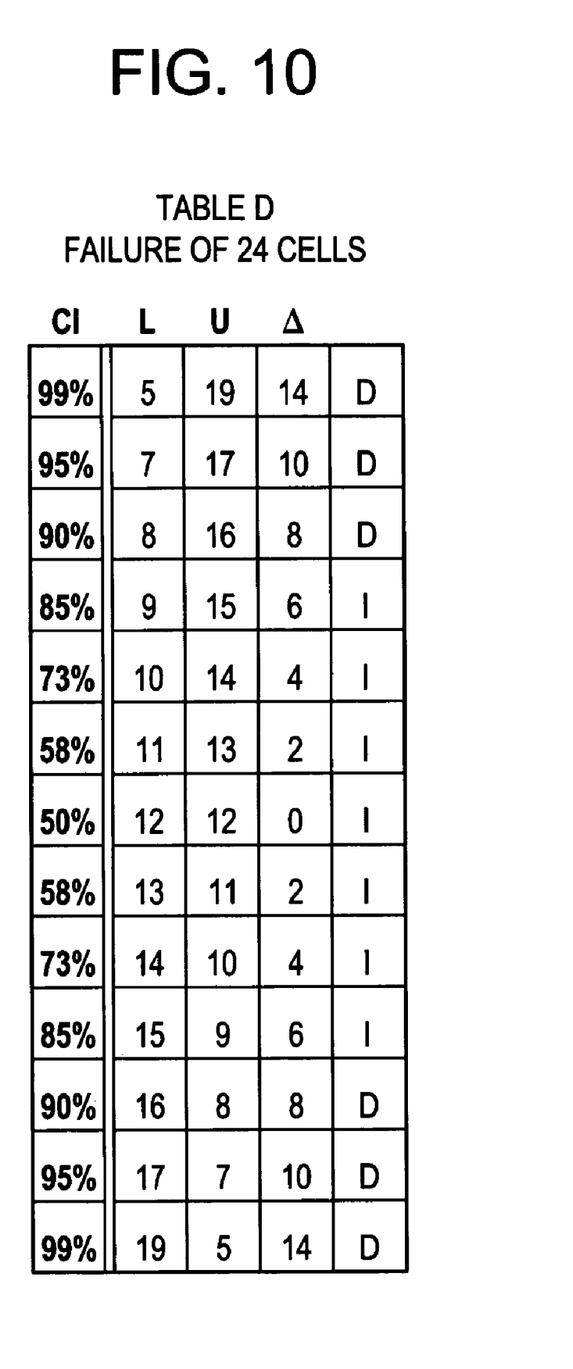
FIG. 10 illustrates a Table D of battery cell failure indications showing a minimum difference in battery cell failures between two segments necessary to reach a predetermined confidence level.

Referring to FIG. 10, the Table D is an adaptation of the probability calculations of FIGS. 8 and 9 showing the differences in failure rates between an upper segment U of a battery and a lower segment L of a battery for a maximum of 24 cell failures. The probability or confidence levels adapted from Table C in FIG. 8 shows the confidence levels to which independence (I) or dependence (D) may be ascribed for particular differences in the failure rates for the illustrated battery. For example, where there is no difference in failure rates between the two sections, there is only a 50% confidence level that the failures are independent. Likewise, there is only a 50% confidence level that the failures are dependent. However, the confidence level that the failures, or at least some part of them, are dependent increases with increases in the difference of the failure rate for either the upper or lower sections. For the system described, when the absolute difference of the failures exceeds eight, the conclusion that the failures are clustered or are dependent grows to a 90% confidence level. When the confidence level is at least 90%, a decision is made to take the battery out of service. Of course it will be recognized that the number 24 is arbitrary number for the maximum failures that a battery can sustain before it is taken out of service and is related to the embodiment shown. The number, of course, could be higher or lower depending upon the decision at what failure level this type, or another type, of battery should have before being taken out of service. Additionally, the confidence level can be raised or lowered depending upon the service department risk orientation, some may require a higher probability and others may require less.

Figure 11:
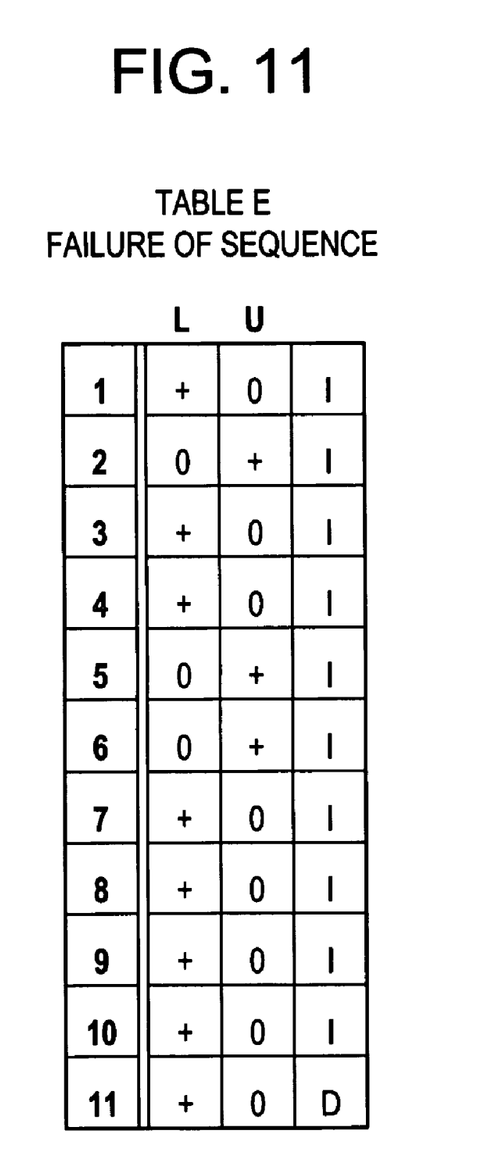

Referring to FIG. 11, another method by which the battery failure data stored in the battery monitor 30 can be used to advantage is a failure sequence testing method for randomness. By observing the sequence in which the cells of the different sections of a particular battery fail, a decision about whether the failure mechanism for these cells is likely random or likely dependent can be made. If the failure mechanism is random, the assumption is that both sections should have cells failing at the same rate. This assumption is consistent with and follows from the assumption for randomness in failures made for the previous test. A long sequence of battery failures in one section as opposed to the other implies a dependent failure and the need of service.

For the embodiment shown, it has been determined statistically that five cell failures in a particular section in sequence implies a dependent failure mechanism for the battery. Table E illustrates the method by which the failure sequence is captured and the decision made to remove a battery from service. When the failure data describing the upper and lower cell failures are stored in the battery monitor 30, it also stores them in sequence table or register in memory to determine the sequence of the failures in addition to the difference. If the first failure of a cell for a battery (1) occurs in the lower bank of cells, a bit is set on the low side of a register (+) and the register is incremented to the next failure sequence location. Similarly, if the next failure (2) is on the upper bank of cells of the battery, the upper side of the register has a bit stored in it (+). This storage of the failure sequence continues until it is determined with a test after each loading that five cell failures for a particular segment of cells have occurred in sequence at failure (11). When the foregoing condition occurs, the battery is taken out of service.

Figure 12:
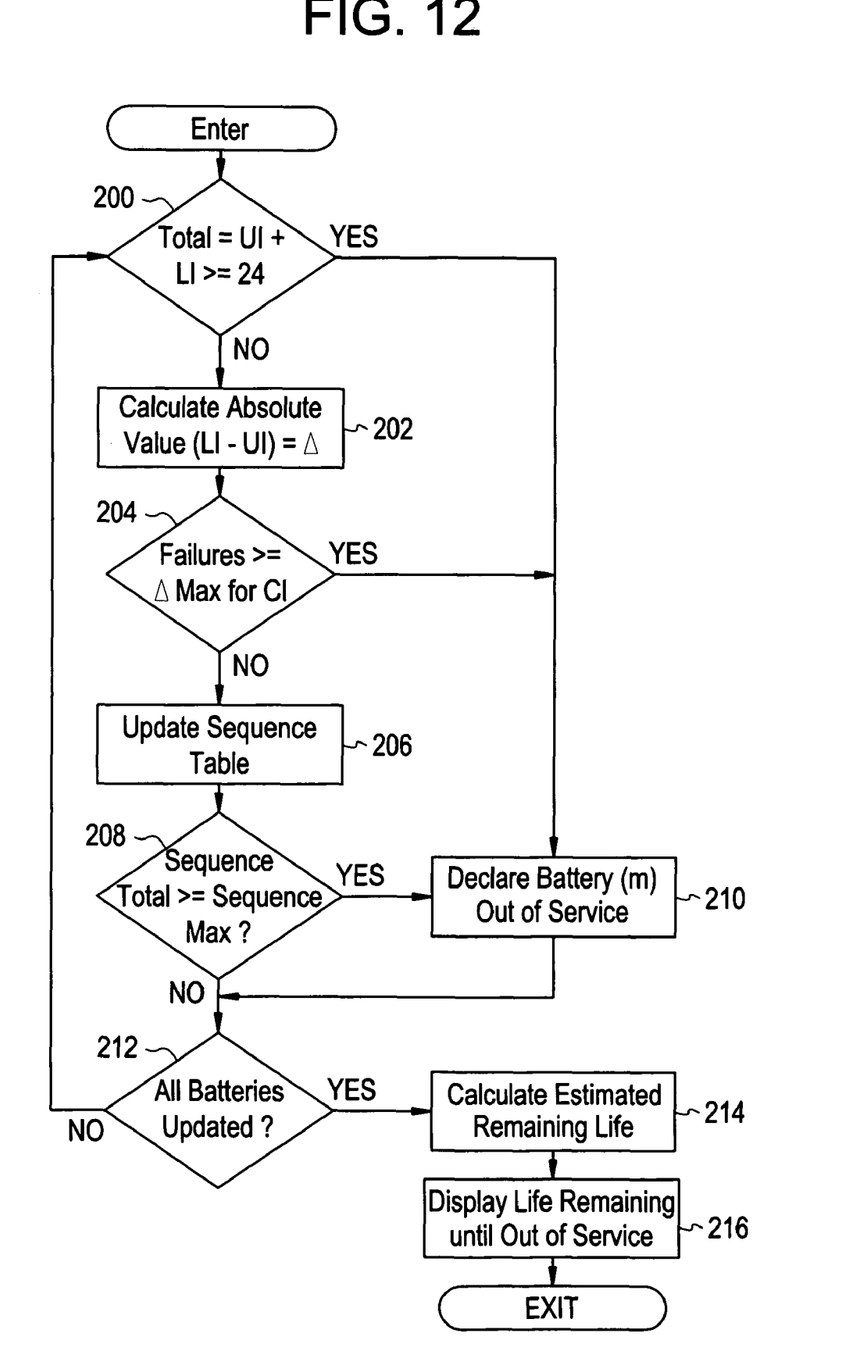
FIG. 12 is a flow chart of a method for testing for a failed operational condition of a battery.

Referring to FIG. 12, a method for determining the failure mechanisms of the battery utilizing the total number of failed cells, the randomness method, or the sequence method is illustrated. The following method can be called at any time but preferably it is opened upon the determination that another cell failure has occurred for a particular battery. For purposes of simplicity, the method will be described with respect to testing the battery 14.

At step 200, the battery monitor 30 makes a determination as to whether the total number of failed cells is greater than a predetermined number of failed cells. If the value of step 200 equals "yes", the method advances to step 210. Otherwise, the method advances to step 202.

At step 202, the battery monitor 30 calculates an absolute difference value ($\Delta$) between the second and third number of cell failures, utilizing the following equation: $\Delta$=Absolute value(L1−U1). After step 200, the method advances to step 204.

At step 204, the battery monitor 30 makes a determination as to whether the absolute difference value ($\Delta$) is greater than or equal to a predetermined difference value for a selected confidence level. If the value of step 204 equals "yes", the method has detected, to the degree of probability selected, that the failure data indicates a dependent event is occurring, and method advances to step 210. Otherwise, the method advances to step 206.

At step 206, the battery monitor 30 loads a sequence table with the new failure data associated with the failed cells. After step 206, the method advances to step 208.

At step 208, the battery monitor 30 makes a determination as to whether a maximum length of a failure sequence for one of the segments of battery 14 is greater than or equal to a predetermined maximum sequence value, for either the upper segment U of cells or the lower segment L of cells. If the value of step 208 equals "yes", the method advances to step 210. Otherwise, the method advances to step 212.

At step 210, the battery monitor 30 indicates that the battery 14 is either out of service or has a failed operational condition. In particular, the battery monitor 30 can induce an indicator light 23 to emit light indicating a failed operational condition of the battery 14. Alternately, the battery monitor 30 can send a message to the controller 22 indicating a failed operational condition of the battery 14. Optionally, the controller 22 upon receiving an indication that battery 14 has a failed operational condition, may electrically decouple battery 14 from the energy storage unit 11 by opening switches 40, 42 to the DC link bus 20, 21. After step 210, the method advances to the step 212.

At step 212, the battery monitor 30 makes a determination as to whether all the batteries in the energy storage unit 11 have been analyzed. The value of step 212 equals "yes", the method advances to step 214. Otherwise, the method returns to the step 200.

Figure 13:
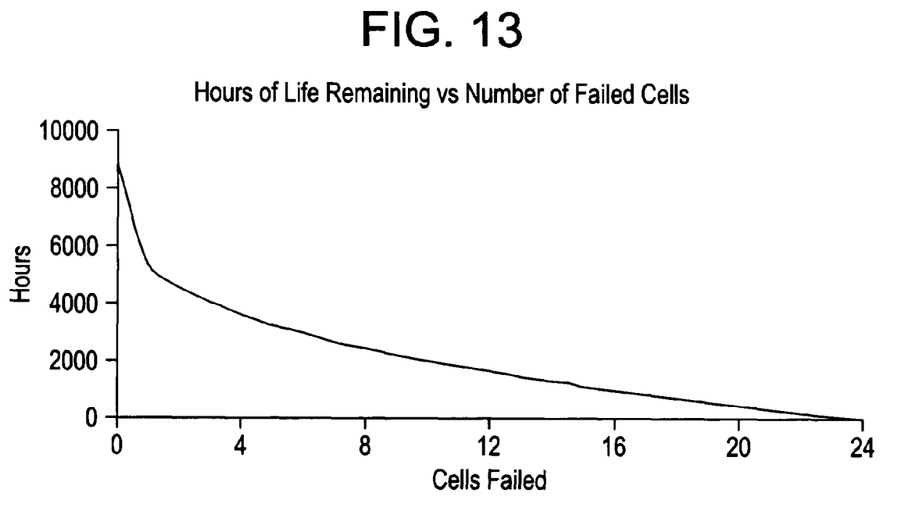
FIG. 13 is a graph indicating an expected remaining life of a battery as a function of the number of failed cells.

At step 214, the battery monitor 30 calculates an estimated remaining life of the battery 14. In particular, the battery monitor 30 has a stored life expectancy function such as that illustrated in FIG. 13, where a total number of failed cells in the battery can be utilized to determine the remaining life of the battery. After step 214, the method advances to step 216.

At step 216, the battery monitor 30, displays the calculated life expectancy of the battery 14 on a display apparatus (not shown) or stores the calculated life expectancy of the battery in the memory. After step 216, the method is exited.

The locomotive, battery system, and methods for monitoring a battery provide a substantial advantage over other systems and methods. In particular, the locomotive, battery system, and methods have the technical effect of determining a number of battery cell failures in a first plurality of cells and in a second plurality of cells to determine whether the battery has degraded operational performance. Still further, a method for determining a probability of a difference between the failure rates of two battery sections is utilized to determine whether the battery has degraded operational performance. Further, a method for determining a particular number of failures in one battery section that occur in a consecutive order is utilized to determine whether the battery has degraded operational performance.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Further, the methods described are not necessarily to be performed only in the sequence illustrated or each step only at the time indicated. Therefore, it is intended that the invention not be limited to the particular embodiment disclosed as the best mode contemplated for carrying out this invention, but that the invention will include all embodiments falling within the scope of the appended claims.

What is claimed is:

1. A method for monitoring a battery, the battery having a first plurality of cells electrically coupled in series to one another, the first plurality of cells comprising a second plurality of cells and a third plurality of cells electrically coupled together at a node, each cell of the first plurality of cells having a desired output voltage level during desired operation and failing in a shorted operational condition, the method comprising:

measuring a first voltage level of the first plurality of cells of the battery when the first plurality of cells are not electrically coupled to a load;

measuring a second voltage level at the node between the second plurality of cells and the third plurality of cells when the first plurality of cells are electrically coupled to the load;

calculating a first number of failed cells in the first plurality cells based on the first voltage level, the desired output voltage level of each cell of the first plurality of cells and a number of cells in the first plurality of cells;

calculating a second number of failed cells in the second plurality cells based on the first number of failed cells, the desired output voltage level of each cell of the first plurality of cells, and the second voltage level; and calculating a third number of failed cells in the third plurality cells based on the first number of failed cells, the desired output voltage level of each cell of the first plurality of cells, and the second voltage level.

2. The method of claim 1, further comprising:

determining when the battery has a failed operational condition based on at least one statistical test using the first number of failed cells.

3. The method of claim 1, further comprising:

determining when the battery has a failed operational condition based on at least one statistical test using at least two of the group comprising the first number of failed cells, the second number of failed cells and the third number of failed cells.

4. The method of claim 1, further comprising:

determining when the battery has a failed operational condition based on a least one statistical test using at least two of the group comprising the first number of failed cells, the second number of failed cells and the third number of failed cells and wherein the statistical test further indicates the cell failures are not random to a statistical confidence level.

5. The method of claim 1, further comprising:

determining when the battery has a failed operational condition based on at least one statistical test using at least two of the group comprising the first number of failed cells, the second number of failed cells and the third number of failed cells and wherein the statistical test further indicates the cell failures are not random based upon a sequence of cell failures.

6. The method of claim 1, wherein the battery has been assigned a useful life, further comprising:

storing at least two of the group comprising first number of failed cells, the second number of failed cells and the third number of failed cells; and storing an operating parameter of the battery related to a useful life of the battery.

7. The method of claim 6, further comprising storing a number of times the battery has been charged.

8. The method of claim 6, further comprising storing a number of times the battery has been discharged.

9. The method of claim 6, further comprising storing a time in service of the battery.

\* \* \* \* \*